United States Patent
Streifler

(10) Patent No.: US 7,507,929 B2
(45) Date of Patent: Mar. 24, 2009

(54) CAPACITIVE CONTACT SWITCH

(75) Inventor: Rolf Streifler, Balingen (DE)

(73) Assignee: E.G.O. Control Systems GmbH (DE)

( * ) Notice: Subject to any disclaimer, the term of this patent is extended or adjusted under 35 U.S.C. 154(b) by 169 days.

(21) Appl. No.: 10/559,193

(22) PCT Filed: Jun. 2, 2004

(86) PCT No.: PCT/EP2004/005949

§ 371 (c)(1),
(2), (4) Date: Jun. 27, 2006

(87) PCT Pub. No.: WO2004/107062

PCT Pub. Date: Dec. 9, 2004

(65) Prior Publication Data

US 2007/0068789 A1    Mar. 29, 2007

(30) Foreign Application Priority Data

Jun. 3, 2003    (DE) ................. 103 26 684

(51) Int. Cl.
*G06F 3/02* (2006.01)
*H03K 17/975* (2006.01)

(52) U.S. Cl. ............... 200/600; 345/156; 345/170; 345/173

(58) Field of Classification Search ......... 345/156–184; 178/18.01–18.11; 200/600
See application file for complete search history.

(56) References Cited

U.S. PATENT DOCUMENTS

| 5,239,152 | A | 8/1993 | Cadwell et al. |
| 5,453,960 | A * | 9/1995 | Teres et al. ............ 368/69 |
| 6,664,489 | B2 | 12/2003 | Kleinhans et al. |
| 2002/0145594 | A1 * | 10/2002 | Derocher ............ 345/173 |
| 2002/0149572 | A1 | 10/2002 | Schula et al. |
| 2003/0122794 | A1 * | 7/2003 | Caldwell ............ 345/173 |

FOREIGN PATENT DOCUMENTS

| DE | 29519714 U1 | 2/1996 |
| DE | 20004404 U1 | 7/2001 |
| DE | 20119700 U1 | 2/2002 |
| EP | 1 207 439 A1 | 5/2002 |
| EP | 1207439 A1 | 5/2002 |

* cited by examiner

*Primary Examiner*—David L Lewis
(74) *Attorney, Agent, or Firm*—Akerman Senterfitt

(57) ABSTRACT

A detector for a capacitive contact switch comprises a flat material consisting of a transparent carrier foil and a ITO-coating. The ITO coating is embodied in the form of a transparent electric conductor. The flat material can be arranged between a transparent cover and a lighted display in such a way that a sensor element is obtained. The flat material as the sensor element 10 makes it possible to represent an illuminated symbol or the corresponding display thereof.

12 Claims, 1 Drawing Sheet

CAPACITIVE CONTACT SWITCH

FIELD OF APPLICATION AND PRIOR ART

The invention relates to a sensor device for producing a switch signal or trigger signal in the case of an approach or contact of a sensor element of the sensor device by the approach of a finger or the like.

Such a sensor device is known from DE 201 197 00.6, where an electrically conductive coating, for example as an impression, is provided behind a cover in the form of a glass or plastic panel and is electrically contacted with a corresponding control.

PROBLEM AND SOLUTION

The problem of the invention is to provide an aforementioned sensor device allowing a further development of the prior art.

This problem is solved by a sensor device having the features of claim 1. Advantageous and preferred developments of the invention form the subject matter of the further claims and are explained in greater detail hereinafter. By express reference the wording of the claims is made into part of the content of the description.

According to the invention an aforementioned sensor device has a capacitive sensor element in flat form and defining a surface. It has an impression or coating containing conductive material. Thus, the sensor element forms an electrically conductive surface. The sensor element is placed on the back of a flat panel remote from a user. Said panel can for example be provided on an electrical appliance and is translucent or transparent. The sensor element is conductively connected to a control for controlling and evaluating the sensor element. According to the invention the impression or coating, respectively the sensor element are transparent or translucent. This permits an illumination or illuminated display to be provided below a sensor element without any need for corresponding cutouts or light passages in said sensor element. This in particular makes it possible to associate the function of a contact switch with a sensor element directly with a corresponding display or illumination. This permits a particularly good identification for a user.

The transparent impression or coating can advantageously extend over the entire sensor element surface or advantageously forms the entire sensor element. This permits a unitary structure. Alternatively only part of the sensor element surface has a transparent impression or coating. This can be in symbol form, for example so as to display a symbol through transillumination.

In one embodiment of the invention the sensor element or the impression or coating can be non-detachably applied to the panel. For example, a thin, conductive, transparent coating as the sensor element can be pressed onto a back surface of a panel. This can be advantageous, because in this way mechanical problems can be prevented, for example the sliding or falling of the sensor element. In addition and in particular with capacitive sensor elements, disturbing gaps can be avoided.

In another embodiment of the invention the sensor element can be pressed onto a transparent or translucent film or can be applied in coating form. This film, which consequently so-to-speak carries the sensor element, can be applied to the back surface of the panel. Thus, the sensor element and panel are separate components. This for example makes it possible to more easily manufacture the panel and a more flexible assembly of different components is possible.

In the aforementioned embodiment of the invention the film can also integrally not only form the sensor element, but the contacting on the control. To this end use can be made of the conductive impression or coating. Thus, the film can pass from the back of the panel in one piece to the control, which can be positioned with a certain spacing behind the panel. If the control is placed on a printed circuit board, the film can extend up to the latter, where it can be fixed in electrically contacting manner for example on a correspondingly constructed contact bank. For example, electrically conductive adhesives, as well as a preferably resilient clamping are suitable here.

An illuminating means can be provided on the back of the panel behind the sensor element and can have a light guide with an associated illumination. A light guide has the advantage that the illumination, which can for example be a LED, glow lamp, etc., can be located at a different or remote point. Moreover, for example through flat light guides which can have a light deflection very low overall heights can be achieved, which would otherwise be difficult to bring about.

It is advantageous for the fight guides and illumination, for example LEDs, to be separate or at least separable components, which permits greater flexibility. It is also conceivable to illuminate several sensor elements with a single LED via several light guides.

If an illuminating means as a module is placed behind a sensor element and the latter is in film form, the sensor element can extend around the illuminating means, preferably in surrounding or enveloping manner. As a result the illuminating means and sensor elements jointly or reciprocally fix another. Furthermore the illuminating means can be pressed against the area of the sensor element or film engaging with the back of the panel, so as to permit the placement and fixing of the sensor element. In this area the sensor element or film can be loose and only undergo fixing through the illuminating means.

According to a further development of the invention the illuminating means can have a display. This can be a seven-segment display, for example a LED display or a vacuum-fluorecent display (VF display). These displays light up automatically, require no independent illumination and are readily recognizable through the transparent panel and transparent sensor element.

Another advantage of a transparent, capacitive sensor element is that in this way the sensor element function can be directly illuminated. This more particularly applies when using illuminated symbols on which a user places the finger so as to allow a very troublefree operation.

The electrical conductivity of the impression or coating can be brought about through electrically conductive components. They can on the one hand be for example graphite or the like and on the other can be metallic components. One possible example is indium-tin oxide (ITO). It is also advantageous for the coating to have a limited thickness. This reduces costs and a sensor element in film form has higher flexibility. Limited thickness is also advantageous for the transparency of the impression or coating. Exemplified thicknesses are 5 to 100 µm, particularly 10 to 20 µm.

These and further examples can be gathered from the claims, description and drawings and the individual features, in each case singly or in the form of subcombinations, can be implemented in an embodiment of the invention and in other fields and can represent advantageous, independently protectable constructions for which protection is claimed here. The subdivision of the application into individual sections and the subheadings in no way restrict the general validity of the statements made thereunder.

BRIEF DESCRIPTION OF THE DRAWINGS

Embodiments of the invention are described in greater detail hereinafter relative to the diagrammatic drawings, wherein show.

DETAILED DESCRIPTION OF EMBODIMENTS

Figure 1:
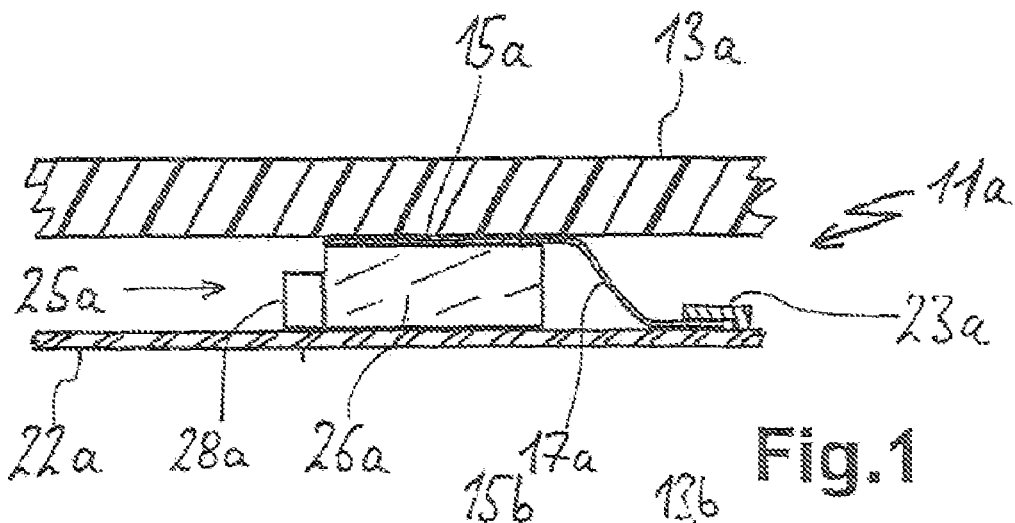
FIG. 1 A section through a sensor device according to the invention under a transparent cover, a conductively coated film forming a sensor element behind which is placed an illuminated display.

FIG. 1 illustrates a first possibility of a sensor device 11a. Below a cover 13a, which can be transparent and can for example be an operating or control panel of an electrical appliance, is located the sensor device 11a. The sensor device 11a comprises a capacitive sensor element 15a forming a surface and engaging on the underside of the cover 13a.

Figure 3:
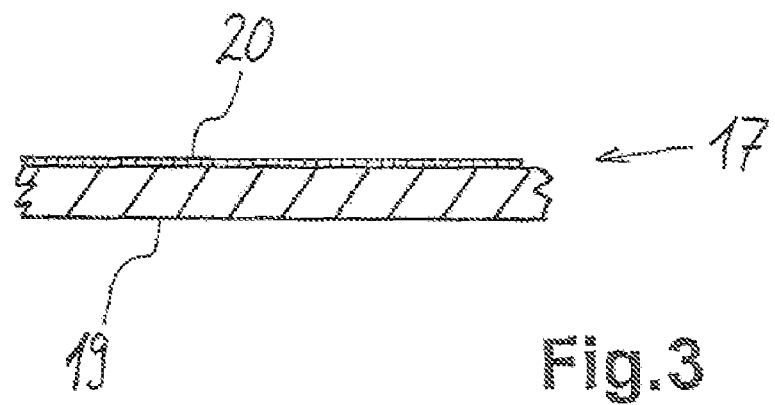
FIG. 3 A section through a film with a conductive coating.

FIG. 3 shows a flat material 17 from which the sensor element 15a can be formed. The flat material 17 is formed by a carrier film 19, which can have a limited thickness, for example a few tenths of a millimeter or even less and can be transparent. A coating 20 is placed on one side of the carrier film 19, the top in FIG. 3. This coating 20 can for example be of so-called ITO. This has the advantage that it has a good electrical conductivity, even in the case of small coating thicknesses. In addition, with such small coating thicknesses it is transparent or translucent. The thickness of the coating 20, in the case of an ITO coating, can be 50 μm or less.

It is advantageous if the flat material 17, respectively carrier film 19 together with the coating are bendable or flexible. Thus, the flat material 17 can be simultaneously used as an electrical contacting or flexible, electrical coating. Thus, for example shapes such as are shown in FIGS. 1 and 2 can be obtained.

In the case of the sensor device 11a according to FIG. 1, the flat material 17 which in the vicinity of the back of the cover 13a forms the sensor element 15a, passes in a S-shaped arc away from the cover. It is mechanically held in a contact clip 23a and electrically contacted. The contact clip 23a can be constructed in such a way that it produces the electrical contact between flat material 17, electrically conductive coating 20 respectively and a corresponding connection on the printed circuit board 22a on which the contact clip 23a is located. The contact clip 23a can be resilient for this purpose. Further possibilities are provided by electrically conductive bonds. From the contact clip 23a a connection passes to a control 24a, to which no further reference need be made here, because it can be constructed in a conventional manner for capacitive sensor elements.

An illuminated display 25a is located on the back of the sensor element 15a and is formed by a light guide element 26a and a laterally positioned LED 28a. The light guide element 26a and LED 28a are advantageously located on the same printed circuit board 22a and are in particular electrically contacted like the contact clip 23a. Thus, the printed circuit board 22a together with the components located thereon can form a module. The sensor element 15a can either be loosely clipped between the light guide element 26a and cover 13 or can be firmly connected, for example bonded to the light guide element 26a. In place of an illuminated display 25a it is possible to have a seven-segment display or the like.

Figure 2:
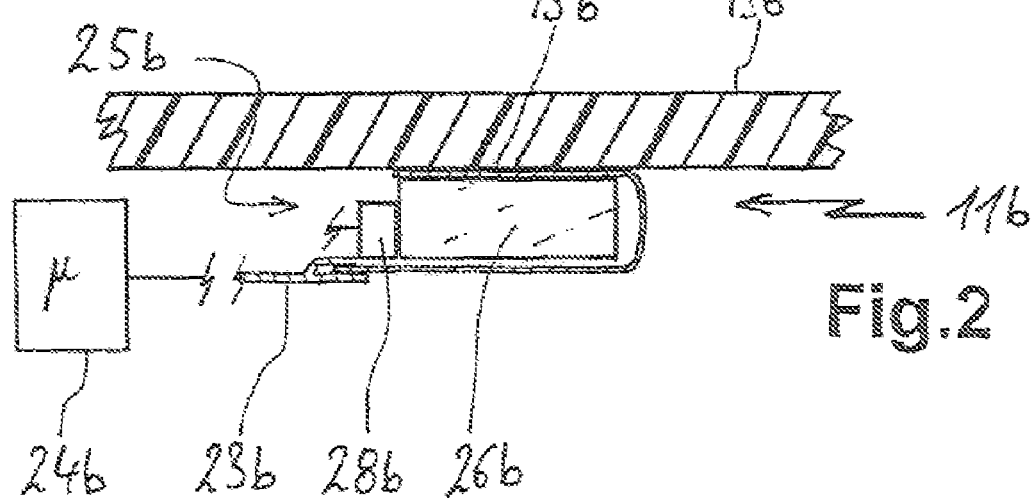
FIG. 2 A variant of the arrangement of FIG. 1, in which the film is placed around the illuminated display and leads to a contacting.

In the variant of the sensor device 11b according to FIG. 2, there is also a sensor element 15b formed from flat material 17b. In the region in which the flat material 17b forms the sensor element 15b, the latter is pressed by an illuminated display 25b against the underside of the cover 13b. The illuminated display 25b is essentially constructed in the same way as that shown in FIG. 1.

Through the other free end the flat material 17b, after passing once around the illuminated display 25b, projects into a contact clip 23b, which is constructed in similar manner to a recording fork or the like and can be made from metal. The end of the flat material 17b can be clipped therein and electrically contacted. It is unimportant here as to which side of the flat material 17b has a conductive coating. The contact clip 23b leads to the control 24b.

In a further development of the invention it is possible to apply a capacitive element with a conductive surface, for example by printing on to the back of the cover 13. Through the provision of a conductive flat material 17, similar to FIGS. 1 or 2, electrical contacting can easily be brought about. The transparent properties of the flat material, particularly also the electrically conductive coating 20, make it possible to place illuminations or illuminated displays behind the same. The electrically conductive surfaces of sensor elements, particularly capacitive sensor elements, in this case no longer need corresponding cutouts, such as has hitherto been the case, in order to permit light transillumination.

FUNCTION

As regards the function, in the case of an illuminated display 25a according to FIG. 1, light from the LED 28a is laterally irradiated into the light guide element 26a. The latter reflects the light forwards through the flat material 17 or sensor element 15a and the cover 13. Thus, back illuminated sensor elements can be created, which as a result of additional printing or masks or the like can have a specific appearance on the light guide element or sensor element and which can for example be the display of a symbol, etc.

The representations, particularly of the sensor devices 11a and 11b in FIGS. 1 and 2, make it clear to what extent an inventive sensor device or the construction of the conductively coated flat material 17 can provide novel and advantageous possibilities of creating electrical connections in general and capacitive sensor elements in particular. As a result of the flexible properties of the flat material 17, a multiple guidance and contacting are possible. This makes it possible to create an integral construction of sensor element or sensor element surface and electrical contacting or lead.

The invention claimed is:

1. A sensor device for producing a switch signal on approaching or contacting a sensor element through an approach of a finger or the like of a user, said sensor device having:

a capacitive sensor element defining a surface and having an impression or coating comprising electrically conductive material, a flat panel of translucent or transparent material, said capacitive sensor element being located on a back surface of said flat panel remote from said user, and a control connected to said sensor element, wherein said sensor element has a conductive contacting with said control, wherein said impression or coating of said sensor element is transparent and is applied to a transparent film placed on a back of said panel, and wherein said film integrally forms said sensor element and an electrical contact to said control, wherein said film extends in one piece from a back of said panel to said control, said control being located on a printed circuit board and said film extending up to said printed circuit board.

2. The sensor device according to claim 1, wherein said impression or coating extends over most of a surface of said sensor element.

3. The sensor device according to claim 1, wherein a part of a surface of said sensor element has an impression in the form of a symbol.

4. The sensor device according to claim 1 wherein said sensor element is non-detachable applied to said panel.

5. The sensor device according to claim 1, wherein an electrical contact of said film to said control is achieved via a fixing to a contact bank of said control.

6. The sensor device according to claim 1, wherein behind said sensor element is provided on a back of said panel an illuminating means.

7. The sensor device according to claim 6, wherein one said sensor element in the form of a film passes at least partly around said illuminating means.

8. The sensor device according to claim 6, wherein said illuminating means is pressed against an area of said film on a back of said panel and said film area is loose.

9. Sensor device according to claim 6, wherein said illuminating means have a display.

10. The sensor device according to claim 4, wherein said sensor element is in the form of a thin, conductive coating.

11. The sensor device according to claim 6, characterized in that said illuminating means is a light guide with a LED for illumination purposes.

12. The sensor device according to claim 1, wherein the film engages flat on the back of the panel.

\* \* \* \* \*